United States Patent
Rothbart

(10) Patent No.: US 9,927,479 B2
(45) Date of Patent: Mar. 27, 2018

(54) SUMP/EJECTOR PUMP MONITOR AND SUMP/EJECTOR PUMP FAILURE WARNING SYSTEM

(71) Applicant: RF GROUP LLC, Fort Lauderdale, FL (US)

(72) Inventor: Michael B. Rothbart, Fort Lauderdale, FL (US)

(73) Assignee: RF Group LLC, Fort Lauderdale, FL (US)

( * ) Notice: Subject to any disclaimer, the term of this patent is extended or adjusted under 35 U.S.C. 154(b) by 0 days.

(21) Appl. No.: 15/597,972

(22) Filed: May 17, 2017

(65) Prior Publication Data

US 2017/0248643 A1   Aug. 31, 2017

Related U.S. Application Data

(63) Continuation of application No. 14/295,685, filed on Jun. 4, 2014, now Pat. No. 9,696,360.

(51) Int. Cl.
| | |
|---|---|
| *F04B 51/00* | (2006.01) |
| *F04D 15/02* | (2006.01) |
| *G01R 31/34* | (2006.01) |
| *G01R 31/02* | (2006.01) |
| *F04B 49/04* | (2006.01) |

(52) U.S. Cl.
CPC ............ *G01R 31/02* (2013.01); *F04B 51/00* (2013.01); *G01R 31/343* (2013.01); *F04B 49/04* (2013.01); *F04D 15/0245* (2013.01)

(58) Field of Classification Search
CPC .................. G01R 31/02; G01R 31/343; F04B 2203/0201; F04B 51/00; F04B 49/04; F04B 49/06; F04D 9/033; F04D 9/045; F04D 9/046; F04D 15/00; F04D 15/02; F04D 15/0245

USPC ............................. 417/44.1, 44.11; 307/38
See application file for complete search history.

(56) References Cited

U.S. PATENT DOCUMENTS

| | | |
|---|---|---|
| 3,932,853 A | 1/1976 | Cannon |
| 3,941,507 A | 3/1976 | Niedermeyer |
| 4,187,503 A | 2/1980 | Walton |
| 4,369,438 A | 1/1983 | Wilhelmi |
| 4,396,353 A | 8/1983 | MacDonald |
| 4,456,432 A | 6/1984 | Mannino |

(Continued)

OTHER PUBLICATIONS

PumpAlarm.com, Water Damage Can Easily Cost Thousands to Repair, printed from http://www.pumpalarm.com/ on Aug. 2, 2014 (4 pages).

(Continued)

*Primary Examiner* — Nathan Zollinger
(74) *Attorney, Agent, or Firm* — Neal, Gerber & Eisenberg LLP

(57) ABSTRACT

A sump, ejector, or other pump monitor configured to monitor the amperage of electric current power supplied through the pump monitor to a pump and communicate one or more signals regarding the amperage or variations in amperage to a remote signal receiving device which indicate a predicted failure or actual failure of the pump. In various embodiments, the pump monitor operates with a remote pump failure warning system. The remote signal receiving device or remote pump failure warning system provides suitable warnings to one or more user access devices.

25 Claims, 2 Drawing Sheets

(56) References Cited

U.S. PATENT DOCUMENTS

| | | | |
|---|---|---|---|
| 4,808,865 A | 2/1989 | King | |
| D311,702 S | 10/1990 | Kern | |
| 5,324,170 A | 6/1994 | Anastos et al. | |
| D353,548 S | 12/1994 | Witzke | |
| 5,672,050 A * | 9/1997 | Webber | F04B 49/022 417/18 |
| D386,100 S | 11/1997 | Thibault | |
| 5,793,294 A | 8/1998 | Schepka | |
| 5,898,374 A | 4/1999 | Schepka | |
| 6,139,281 A | 10/2000 | Schooler | |
| 6,375,430 B1 | 4/2002 | Eckert et al. | |
| 6,462,666 B1 | 10/2002 | Einck | |
| 6,464,531 B2 | 10/2002 | Eckert et al. | |
| 6,640,196 B1 | 10/2003 | Unsworth et al. | |
| 6,649,839 B2 | 11/2003 | Eckert et al. | |
| 6,676,382 B2 | 1/2004 | Leighton et al. | |
| 7,309,216 B1 * | 12/2007 | Spadola, Jr. | F04B 49/02 417/18 |
| 7,389,278 B2 * | 6/2008 | Unsworth | F04D 15/0077 700/286 |
| 7,429,842 B2 | 9/2008 | Schulman et al. | |
| 7,746,243 B2 | 6/2010 | Chen et al. | |
| 7,843,081 B2 * | 11/2010 | Lim | H01R 13/6641 307/11 |
| 8,047,805 B2 | 11/2011 | Bourell, Jr. et al. | |
| 8,297,937 B2 * | 10/2012 | Johnson | F04D 15/0088 417/44.11 |
| 8,409,124 B2 | 4/2013 | Steffens et al. | |
| 8,500,412 B2 | 8/2013 | Williams et al. | |
| 8,774,972 B2 * | 7/2014 | Rusnak | F04D 15/0066 415/122.1 |
| 9,157,434 B2 * | 10/2015 | Leonard | F04B 23/021 |
| 9,441,625 B2 * | 9/2016 | Schoendorff | F04B 51/00 |
| 9,500,193 B2 * | 11/2016 | Knight | F04B 51/00 |
| 9,528,512 B2 * | 12/2016 | Cummings | F04B 49/025 |
| 2002/0047783 A1 | 4/2002 | Bergum et al. | |
| 2003/0049134 A1 | 3/2003 | Leighton et al. | |
| 2003/0115890 A1 | 6/2003 | Jayanth et al. | |
| 2006/0045105 A1 | 3/2006 | Dobosz et al. | |
| 2006/0072269 A1 * | 4/2006 | Staples | G01R 19/16571 361/93.1 |
| 2006/0176000 A1 | 8/2006 | Schulman et al. | |
| 2007/0286737 A1 | 12/2007 | Johnson | |
| 2008/0031751 A1 * | 2/2008 | Littwin | F04B 47/06 417/411 |
| 2008/0298978 A1 | 12/2008 | Schulman et al. | |
| 2009/0185914 A1 | 7/2009 | Elnar | |
| 2009/0208345 A1 | 8/2009 | Moore et al. | |
| 2011/0085919 A1 | 4/2011 | Williams et al. | |
| 2011/0311370 A1 | 12/2011 | Sloss et al. | |

OTHER PUBLICATIONS

Mike Szczys, Sump Pump Alarm Sends Text Message as Water Rises, posted on http://hackaday.com/2013/04/30/sump-pump-alarm-sends-text-message-as-water-rises/ . . . on Apr. 30, 2013 (14 pages).

1/2 HP Sump Pump System with AdvanText Cellular F1 . . . , printed from https://buynow.waynepumps.com/modeldetail/AdvanTEXT-flood-alert_WTX502, on Aug. 2, 2014 (1 page).

Cathy MacDowell, Best Basement Flood Protection: Sump Pumps and "Early Warning" Devices, posted on http://blog.diycontrols.com/index.php/best-basement-flood-protection-sump-pumps-and-ear . . . on Jan. 27, 2012 (3 pages).

Observer 500 Series Indoor/Outdoor High Water Alarm, printed from http://www.septicsolutions.com/SepticTankAlarm/HighWaterAlarms.html?gclid=CLS 29Nr . . . on Aug. 2, 2014 (11 pages).

Semiconductor Components Industries LLC, Universal Voltage Monitors, Dec. 2008 (18 pages).

RV Wholesalers, AC Line Monitor/Polarity Tester, printed from http://www.rvwholesalers.com/catalog/ac-line-monitor_polarity-tester.html?gclid=CNnAm . . . on Aug. 2, 2014 (8 pages).

International Search Report and Written Opinion of the International Searching Authority, dated Oct. 28, 2015, for International Application No. PCT/US15/33494 (17 pages).

* cited by examiner

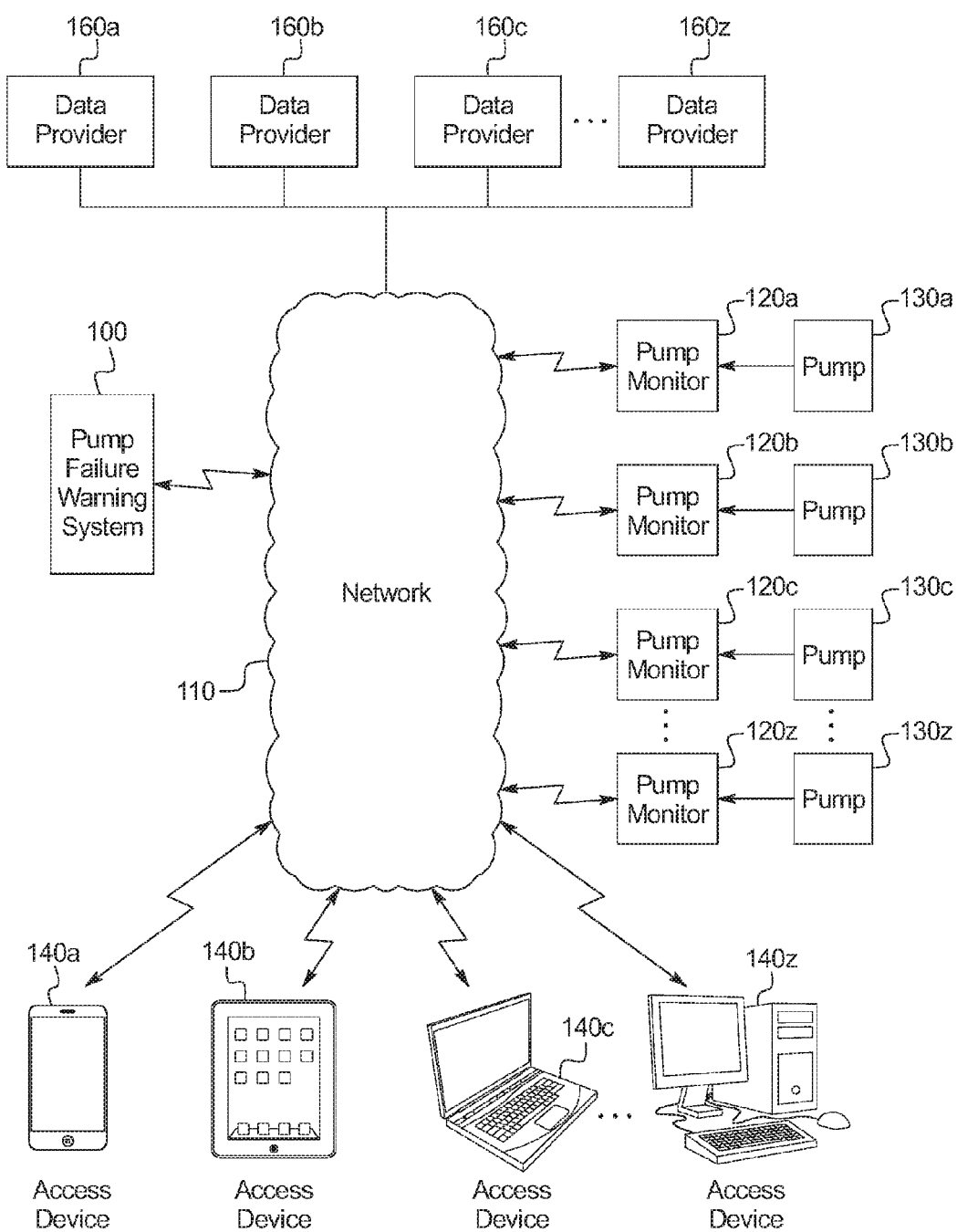

SUMP/EJECTOR PUMP MONITOR AND SUMP/EJECTOR PUMP FAILURE WARNING SYSTEM

PRIORITY CLAIM

This application is a continuation of, and claims priority to and the benefit of U.S. patent application Ser. No. 14/295,685, which was filed on Jun. 4, 2014, the entire contents of which are incorporated herein by reference.

BACKGROUND

Sump pumps and ejector pumps are widely used throughout the world in sumps, basins, or pits of structures (such as buildings and houses) to pump water or waste from sanitary collection sumps, basins, or pits to prevent flooding of these structures. Many structures have multiple sumps, basins, or pits and multiple sump or ejector pumps to pump water or waste from sanitary collection sumps, basins, or pits to prevent flooding.

Many different types of sump and ejector pumps are commercially available. Sump and ejector pumps typically run on AC power (such as though a conventional electrical current source) or on DC power (such as though a battery). Sump and ejector pumps are typically submersible in the sump, basin or pit and typically include a pump and an automatic float switch. The automatic float switch turns the pump on when the water level in the sump, basin, or pit rises above a predetermined level and shuts the pump off when the water level in the sump, basin, or pit is below the predetermined level (as a result of pump operation). Automatic mechanical and electronic float switches are well-known in the industry for use in controlling the level of water in the sump, basin, or pit and are commonly are referred to as float, tether, or electronic sensor type switches.

Sump and ejector pumps can fail to operate or fully operate due to many different reasons such as a partial or complete malfunction, breakage, or breakdown of one or more components of the pump (such as the switch or impeller blade), a power source outage or disconnection to the pump, or a blockage in the pump. Sump and ejector pumps are prone to such operational failures due to the environment in the sump, basin, or pit that they operate in, due to the fact that they sometimes sit for long periods of time without operating, and due to the fact that they sometimes frequently turn on and off.

When a sump or ejector pump fails to operate or fully operate, the water level can rise in the sump, basin, or pit and ultimately may lead to a flood in the location of the structure near the pump, in significant parts of the structure, or throughout the entire structure. Even minor amounts of flooding can cause significant damage to a structure (or the contents therein), which is typically expensive to repair or replace. It is thus very important that sump and ejector pumps properly operate at all times and that non-operating, malfunctioning, broken, or blocked pumps are quickly repaired or replaced. Since sump and ejector pumps are in the sumps, basins, or pits, regular maintenance or maintenance checks on these pumps are too often not preformed.

To address these issues, many sump and ejector pump failure detection systems have been proposed. Many of these proposed failure detection systems are built into the pump itself. Various proposed pump failure detection systems detect when a pump is failing to operate in a normal mode or operate at all. For example, various proposed pump failure detection systems detect one or more of the following: (a) a failure of electrical power condition; (b) a jammed or blockage condition; (c) a dry running condition; (d) a stuck float condition; (e) an inadequate pumping rate condition; and (f) a switch failure condition.

One problem with various proposed sump and ejector pump failure detection systems is that by the time that failure detection system has detected the pump failure, it is often too late to fix or replace the pump and thus too late to prevent water damage to the structure (or it contents) due to rising water levels or flooding.

Another problem with various proposed sump and ejector pump failure detection systems is that they have not been widely commercialized due to costs, complications, actual operational effectiveness, or for other reasons.

One widely employed solution to these issues is to provide a back-up pump which is usually powered by one or more batteries. While battery powered back-up pumps can prevent certain flooding when a main AC powered pump is not operational or fully operational, such back-up pump systems increase the cost and complication of the structures, only operate for the life of the batteries, and are also subject to their own failures.

Another proposed solution to these issues is to provide water sensor alarms adjacent to the sump or ejector pumps or in proximity to the sumps, basins, or pits. While such sensor alarms can sense that a sump or ejector pump is not operational or fully operational due to rising water levels, these systems often detect the problem too late to fix or replace the pump and thus too late to prevent water damage to the structure (or it contents) due to rising water levels or flooding.

Another problem with various proposed sump or ejector pump failure detection systems is that they are often configured for specific pumps and are often not configured to be used with the wide variety of different types of commercially available pumps.

Another problem with various proposed sump and ejector pump failure detection systems is that they are difficult and/or time consuming to install.

Another problem with various proposed sump and ejector pump failure detection systems is that they are complicated and thus subject to additional types of failures.

Another problem with various proposed sump and ejector pump failure detection systems is that they are relatively expensive to manufacture, purchase, or install.

Accordingly, there is a need to solve these problems.

SUMMARY

Various embodiments of the present disclosure solve the above problems by providing a sump or ejector pump monitor that predicts when a pump is likely to fail or is actually failing and that provides one or more warning signals which indicate that the pump is likely to fail or is actually failing.

In various embodiments, the pump monitor of the present disclosure generally includes: (a) a portable housing; (b) an electric plug receptacle supported by the housing and configured to receive an electrical power source plug of a pump; (c) a power cord supported by the housing and configured to be plugged into an electrical power source of a structure; (d) a transmitter supported by the housing and configured to send out one or more signals; (e) one or more indicators (such as one or more displays) supported by the housing and configured to indicate or display information; (f) an amperage detector supported by the housing and configured to determine the amperage of the electric current provided to the pump through the pump monitor; (g) an onboard computer supported by the housing and configured to determine variations or deviations from normal in the amperage of the electric current provided to the pump through the pump monitor; and (h) one or more other electrical or mechanical components supported by the housing and configured to facilitate the operation of the transmitter, the indicator(s), the amperage detector, and the onboard computer. The electric plug receptacle, power cord, transmitter, indicator(s), amperage detector, computer, and the other electrical and mechanical components are arranged or configured such that after: (a) the power cord is plugged into a electric power source; and (b) the electric plug of the pump is plugged into the receptacle, (c) the pump will receive its power through the pump monitor; (d) the amperage detector will monitor the amperage of the electric current supplied through the pump monitor to the pump; (e) the onboard computer will determine variations of the amperage of the electric current provided to or used by the pump and the likelihood of or actual failure of the pump; and (f) the transmitter will send out one or more warning signals regarding a predicted failure or actual failure of the pump by the onboard computer.

In various embodiments, to install the sump or ejector pump monitor of the present disclosure, the electric power plug of the pump is unplugged from the electric power supply of the structure and plugged into the pump monitor, and the electric power plug of the pump monitor is plugged into the electric power supply of the structure. The pump monitor of the present disclosure is thus easy to install, and can be installed very quickly without having to remove an existing pump from a sump, basin, or pit.

The present disclosure contemplates various different operational configurations of the sump or ejector pump monitor.

In a first type of operational configuration for the above example embodiment, the pump monitor and specifically the amperage detector continuously or regularly monitors the amperage of the electric current supplied to the pump through the pump monitor, and the onboard computer determines if there are any variations or deviations in the amperage which indicate an impending failure or an actual failure of the pump. This can be considered a "smart" pump monitor because the pump monitor itself is determining or predicting the potential failure or actual failure. When such variations or deviations are detected and such failure is predicted or actual, the transmitter sends one or more warning signals to a remote signal receiving device which in turn alerts the user of such predicted or impending failure or an actual failure of the pump. In certain embodiments, the remote signal receiving device is an alarm system which in turn notifies the user. In other embodiments, the remote signal receiving device is a pump failure warning system as described herein which in turn notifies the user. In other embodiments, the remote signal receiving device is a user access device such as a user's smart phone, computing tablet, desktop or laptop computer, or other suitable device which notifies the user.

In a second type of operational configuration, the sump or ejector pump monitor and specifically the amperage detector continuously or regularly monitors the amperage of the electric current supplied to the pump through the pump monitor, and the transmitter sends signals representing the amperage levels or readings to a remote signal receiving device (such a pump failure warning system described herein) that receives these signals. The remote signal receiving device determines if there are any variations or deviations in the amperage level which indicate an impending failure or actual failure of the pump. In such case, the remote signal receiving device (or other suitable device) notifies or causes the user to be notified of the predicted or impending failure or actual failure of the pump. This can be considered more of a "dumb" pump monitor because it is not itself predicting or determining the predicted or impending failure or actual failure of the pump. In certain such embodiments, the "dumb" pump monitor may not need the onboard computer to operate.

Other operational configurations of the sump or ejector pump monitor include desired combinations of these first and second operational configurations. For example, in one embodiment, when the amperage levels are not normal, the transmitter sends signals representing the amperage levels to a remote signal receiving device that receives these signals. The pump monitor of various embodiments of the present disclosure is configured to work with a wide variety of different pumps as long as the pump has a power cord and a plug and normally operates at one or more amperage levels or operates a certain levels in certain operation modes.

The pump monitor of various embodiments of the present disclosure is also relatively inexpensive.

The pump monitor of various embodiments of the present disclosure is relatively simple and easy to install.

As indicated above, the pump monitor of various embodiments of the present disclosure is also configured to operate in conjunction with a broader pump failure warning system as described in more detail below.

Various embodiments of the present disclosure also provide a pump failure warning system as described in more detail below.

Other objects, features and advantages of the present invention will be apparent from the following detailed disclosure, taken in conjunction with the accompanying sheets of drawings, wherein like reference numerals refer to like parts.

BRIEF DESCRIPTION OF THE FIGURES

FIG. 2 is a schematic high level diagram of one embodiment of the sump or ejector pump failure warning system of the present disclosure, and illustrating the pump failure warning system configured to communicate through a network with a plurality of pump monitors (connected to a plurality of pumps), a plurality of user access devices, and a plurality of data providers.

DETAILED DESCRIPTION

Figure 1:
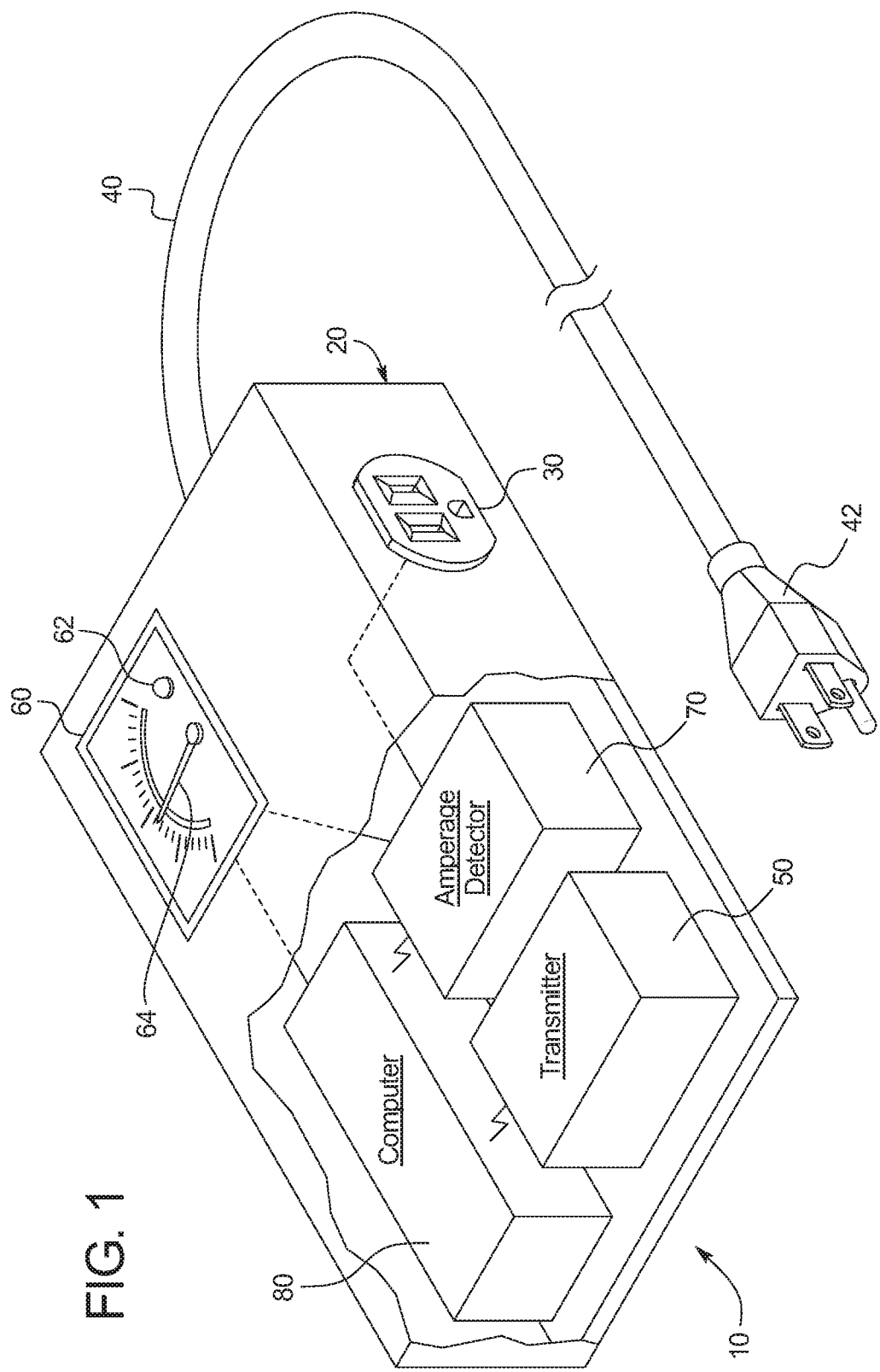
FIG. 1 is a diagrammatic perspective view of one embodiment of a sump or ejector pump monitor of the present disclosure, and illustrating the housing of the pump monitor with certain walls of the housing removed or shown in fragmentary to partially reveal the internal components of the housing.

Various example embodiments of the sump or ejector pump monitor and the sump or ejector pump failure warning system of the present disclosure are described in more detail below. For brevity, the sump or ejector pump monitor of the present disclosure is sometimes referred to herein as the pump monitor or the monitor. For brevity, the sump or ejector pump failure warning system of the present disclosure is sometimes referred to herein as the system. The term "user" is used herein to include the designated person responsible for the monitoring, maintenance, operation, repair, or replacement of the sump or ejector pump. This may be a property owner such as a homeowner, or an operator or maintainer of one or more structures or properties. The user may also be one or more people, but is referred to herein in the singular form. It should also be appreciated that the present pump monitor and the pump failure warning system of the present disclosure can be employed for other suitable pumps.

The Pump Monitor

Turing now to FIG. 1, one embodiment of the pump monitor of the present disclosure is generally illustrated and indicated by numeral 10. This illustrated monitor 10 generally includes: (a) a portable housing 20; (b) an electric plug receptacle 30 supported by the housing 20; (c) a power cord 40 supported by and extending from the housing 20; (d) a transmitter 50 supported by the housing 20; (e) an indicator 60 supported by the housing 20; (f) an amperage detector 70 supported by the housing 20; (g) an onboard computer 80 supported by the housing; and (h) one or more additional electrical or mechanical components (not shown) such as an on/off switch (not shown) supported by the housing 20. These electrical components are suitably electrically connected by the additional electrical components. Generally, the electric plug receptacle 30, power cord 40, transmitter 50, indicator 60, amperage detector 70, onboard computer 80, and other electrical and mechanical components are arranged or configured and electrically and/or mechanically connected such that when the power cord 40 is plugged into an electric power source and an electric plug (not shown) of a pump (not shown) is plugged into the receptacle 30, the pump 10 will receive its electric power through pump monitor 10, the amperage detector 70 will monitor the amperage levels of the electric current supplied through the pump monitor 10 to the pump, the onboard computer 80 will determine if the pump is likely to fail or is actually failing, and the transmitter 50 will send out one or more warning signals regarding any predicted failure or actual failure of the pump.

More specifically, the housing 20 includes a plurality of suitably connected walls 20. It should be appreciated that any suitable housing may be employed in accordance with the present disclosure. It should also be appreciated that in various embodiments, the housing is insulated and/or water proof.

The electric plug receptacle 30 is supported by one or more of the walls of the housing 20. The electric plug receptacle 30 is configured to receive a conventional AC power electric plug (not shown) of a pump (not shown) to provide electric current to the pump. It should be appreciated that the electric plug receptacle 30 may be connected to the housing 20 in any suitable manner and position. It should also be appreciated that any suitable alternative electric plug receptacle (including but not limited to a GFI receptacle) may be employed in accordance with the present disclosure.

The power cord 40 is supported by and extends from one of the walls of the housing 20. The power cord 40 includes an electric plug 42 which is configured to be plugged into a conventional AC electric power source outlet or receptacle (not shown) in this example embodiment. It should be appreciated that the power cord 40 may be connected to the housing 20 in any suitable manner and position. It should also be appreciated that any suitable alternative power cord may be employed in accordance with the present disclosure.

The transmitter 50 is positioned in and connected to the housing 20. Although not shown, the transmitter 50, in various embodiments, includes a suitable antenna (not shown) which may or may not extend out of the housing.

The transmitter 50 can be or include any suitable type of transmitting device. In certain embodiments of the present disclosure, the transmitter 50 is configured to only send out signals. In other embodiments of the present disclosure, the transmitter 50 is configured to send out and receive signals to one or more remote signal receiving devices. In other embodiments of the present disclosure, the transmitter 50 includes a signal receiver (not shown) and a separate signal transmitter (not shown). In certain embodiments, the transmitter 50 uses cellular communications. In other embodiments, the transmitter 50 sends out signals through another data network such as the internet. However, it should be appreciated that the transmitter 50 can use any suitable type of communications. It should also be appreciated that in other embodiments, the pump monitor can be configured to communicate with one or more remote signal receiving devices (such as an alarm system or alarm system panel) through one or more wires that are plugged into or otherwise attached to the pump monitor and such signal receiving devices. It should also be appreciated that the alarm system or alarm system panel may include one or more chips or circuitry configured to suitably process such signals).

The indicator 60 is attached to and supported by one of the walls of the housing 20 in this illustrated embodiment. In certain embodiments, the indicator 60 is configured to indicate that the pump monitor 10 is working or working properly. In certain such embodiments, the indicator 60 includes a suitable light source such one or more light emitting diodes or LEDs such as LED 62 which when lit indicates that the pump monitor 10 is working or working properly.

In certain embodiments, the indicator 60 includes a meter such as meter 64 which continuously or regularly indicates the amperage measurements that the amperage detector 70 detects. In certain embodiments as in this illustrated embodiment, the indicator 60 includes both a suitable light source such as LED 62 and a meter such as meter 64. It should be appreciated that any suitable alternative indicators may be employed in accordance with the present disclosure. It should also be appreciated that in certain embodiments, the pump monitor of the present disclosure does not include any indicators. In certain embodiments without indicators, the user will know that the pump monitor is working because the user receives one or more signals from the pump monitor to a user access device as further explained below.

In certain embodiments, the indicator 60 is configured to indicate that the pump is working or working properly and/or to indicate that the pump is not working, not working properly, or is likely to fail. In certain such embodiments, the indicator 60 includes a suitable light source (not shown) such one or more light emitting diodes or LEDs which when lit indicates that the pump is not working, not working properly, or is likely to fail. It should be appreciated that this light source can be different (such as a different color) than the light source that indicates that the pump monitor is working or working properly.

The onboard computer 80 is positioned in and suitably connected to the housing 20. It should be appreciated that the onboard computer 80 may be any suitable type of automatic electrical or electronic computing device or circuit board. For example, in one example embodiment, the onboard computer includes a processor or microprocessor and a memory device. In another example embodiment, the onboard computer includes an electric circuit hard wired to perform the necessary functions or determinations described herein. For this example embodiment, the onboard computer 80 is configured to: (a) determine variations or deviations from normal in the amperage of the electric current provided to or used by the pump as further described below; (b) determine if the variations or deviations indicate an actual failure of the pump or indicate an impending failure of the pump; and (c) cause the transmitter 50 to send out one or more signals indicating any actual failure or impending failure. The present disclosure contemplates that the onboard computer can additionally cause the transmitter to send one or more other signals such as "power on" signals, "normal operation" signals, or other suitable communication signals to one or more remote signal receiving devices (such as a pump failure warning system or an alarm system).

The other electrical or mechanical components (not shown) are positioned in and connected to the housing and include various necessary electrical or mechanical components which enable electric plug receptacle 30, the power cord 40, the transmitter 50, the indicator 60, the amperage detector 70 and the onboard computer 80 to function together as described herein. It should be appreciated that any suitable electrical and mechanical components may be employed in accordance with the present disclosure.

The amperage detector 70 is positioned in and connected to the housing 20. The amperage detector 70 can be any suitable type of amperage detecting device which provides the functions described herein. Amperage, amperes, or amps are terms often used to refer to a measure of electrical current. In simple terms, amperage, amperes, or amps is considered a measure of the amount of electrons moving in a circuit. In other words, amperage (i.e., in the International System of Units or SI unit for electrical current) is the amount of electrical charge that flows through a conductor in a given time period. For example, one ampere is a charge of one coulomb—about 6.241×1018 electrons—per second flowing in a conductor (such as a wire) past a given point. Electrical devices need a certain amount of electrical energy or current to perform their functions and are often rated according to their amperage, or the amount of electric current they typically draw from a main power supply when operating normally. A small electric device (such as a toaster) usually needs less power than a larger electric appliance (such as a refrigerator). A large electric motor usually draws or uses more amps (such as 100 amps of electric current), while a small heating element usually draws or uses less amps (such as 10 amps of electric current).

As indicated above, there are many different types of commercially available sump or ejector pumps. While many of the sump or ejector pumps operate at a same or substantially same amperage level, various commercially available sump or ejector pumps operate at different or substantially different amperage levels. For example, sump pumps with larger pumps will typically operate at higher amperage levels. The present disclosure accounts for or takes into account these operational amperage level differences in several different manners as discussed below to provide a more universal pump monitor.

Regardless of the normal amperage level, variations or deviations away (i.e., above or below) from the normal amperage level or range are an indication of a potential failure or actual failure of the pump. Each different type of variation or deviation also can indicate different reasons for the failure and different likelihoods of failure (and the expected time frames for the failure). A pump that normally operates at a single amperage level will have the following possible variation or deviation conditions:

(1) starts at higher than normal amps and runs at normal amps;
(2) starts at normal amps and runs at higher than normal amps;
(3) starts and runs at higher than normal amps;
(4) starts at lower than normal amps and runs at normal amps;
(5) starts at normal amps and runs at lower than normal amps;
(6) starts and runs at lower than normal amps;
(7) starts at lower than normal amps and runs at higher than normal amps; and
(8) starts at higher than normal amps and runs at lower than normal amps.

Certain sump or ejector pumps also have multiple different normal operational amperage levels or ranges. For example, certain pumps have two different normal operational amperage levels or ranges. The first amperage level or range is when the pump first starts or goes on (each time the water level rises in the sump, basin, or pit above a predetermined level), and the second amperage level or range is after starting and when the pump is normally operating to pump water. For example, a sump pump may normally start at or go on at 6 amps and normally operate or run at 3 amps. Variations or deviations away (i.e., above or below) from either or both of these normal amperage levels or ranges are indications of a potential failure or actual failure of the sump pump. Each different type of variation or deviation also can indicate different reasons for the failure and different likelihoods of failure (and the expected time frames for the failure). A pump that normally operates at two different amperages will also have the following possible variation or deviation conditions:

(1) starts at higher than normal amps and runs at normal amps;
(2) starts at normal amps and runs at higher than normal amps;
(3) starts and runs at higher than normal amps;
(4) starts at lower than normal amps and runs at normal amps;
(5) starts at normal amps and runs at lower than normal amps;
(6) starts and runs at lower than normal amps;
(7) starts at lower than normal amps and runs at higher than normal amps; and
(8) starts at higher than normal amps and runs at lower than normal amps.

Each one of these different amperage variation or deviation conditions may or may not indicate a different potential failure or actual failure of the pump, or reason for a potential failure or actual failure of the pump. For example, one variation or deviation condition may indicate a potential failure or actual failure due to a broken impeller or a partially blocked pump. The different amperage variations or deviations may also be different indicators for different pumps.

As mentioned above, the present disclosure contemplates various different operational configurations for the amperage detector and the pump monitor. The operational configurations are generally "smart" or "dumb" configurations.

In various "smart" configuration embodiments, the amperage detector 70 detects the amount of amps used by the pump on a continuous or regular basis and the onboard computer 80 determines any designated variations or deviations of the amperage level from the normal amperage levels. The onboard computer 80 determines if there are any variations or deviations from the normal operation of the pump and alone (or in combination with other data as discussed below) and determines whether the pump is likely to fail or is actually failing. In certain embodiments, this determination includes how likely it is that the pump will fail and the estimated time frame when the pump will fail. The present disclosure contemplates that these determinations can be made in any of a variety of different manners. In these "smart" configurations, the onboard computer will also be able to determine if power is being supplied to the pump through the pump monitor 10 or there is a power outage or disconnection.

In various "smart" configuration embodiments, the onboard computer 80 "knows" or has the appropriate data that represents the amperage level or levels that the specific pump that the pump monitor is connected to will normally start and normally operate at. It should be appreciated that the onboard computer can have or obtain this normal amperage level data in a variety of different manners in accordance with the present disclosure.

In a first manner, the onboard computer is initiated with a predetermined amperage level and the monitor is rated for a pump with that amperage level. For example, the pump monitor is configured to monitor pumps which operate at 3 amps and any significant variation from the 3 amp level causes the onboard computer to cause the transmitter to send out one or more signals regarding the variation to a remote signal receiving device. In another example, the pump monitor is configured to monitor pumps which start at 6 amps and operate at 3 amps and any significant variation from the starting 6 amp level or the operating 3 amp level causes the onboard computer to cause the transmitter to send out one or more signals regarding the variation to one or more remote signal receiving devices (such as an alarm system or a pump failure warning system).

In a second manner, the onboard computer is initiated with a plurality of predetermined amperage levels and the pump monitor is rated for a pump having any one of those normal amperage levels. In this embodiment, the pump monitor first operates in an initiation mode, where the onboard computer determines which of the different predetermined amperage level or levels is appropriate for the pump connected to that pump monitor. In this way, during the initiation mode, the pump monitor learns the normal operating amperage level(s) of the pump.

In a third manner, the onboard computer does not have any preset amperage level. The pump monitor first operates in an initiation mode, where the onboard computer determines the normal amperage level or levels of the pump connected to that pump monitor.

In a forth manner, the onboard computer does not have any preset amperage level. The transmitter of the pump monitor is configured to receive signals from one or more remote devices (such as a pump failure warning system). The remote device sends the transmitter first signals which indicate the normal amperage level or levels of the pump connected to that pump monitor. In this embodiment, a user may enter pump related information into a user access device which in turn causes these signals to be sent to the transmitter directly or through remote device (such as a pump failure warning system).

In a fifth manner, the onboard computer does not have any preset amperage level. The pump monitor includes an input device such as a switch or dial (not shown) which is suitably connected to the onboard computer. The input device enables the user to input the normal amperage level or levels of the pump connected to that pump monitor. In one embodiment, the onboard computer stores this inputted information.

It should be appreciated that other suitable manners of providing the onboard computer with the appropriate amperage levels may be employed in accordance with the present disclosure.

In various "dumb" configuration embodiments, the amperage detector detects the amount of amps used by the pump on a continuous or regular basis and the transmitter sends signals to one or more remote signal receiving devices (such as a pump failure warning system) which receives these signals and determines if there are any variations in the amperage amounts detected. In these "dumb" embodiments, the pump monitor acts as a dumb device because it does not itself determine if there are variations or deviations from normal operation of the pump and thus does not determine or predict a potential failure or actual failure. In these embodiments, the pump monitor can be used with any pump regardless of the normal amperage level(s) of the pump because the pump monitor does not need to know these normal amperages level(s) to function. In certain of these embodiments, the pump monitor does not need to have an onboard computer.

In various "dumb" configuration embodiments, the remote signal receiving device (such as a pump failure warning system) computer which receives the signals from the transmitter determines based on these signals or the data provided by these signals if there are any variations or deviations from the normal operation of the pump and whether the pump is likely to fail or is actually failing. The remote signal receiving device is configured to use the data from these signals and data regarding the normal amperage levels of the pump to determine the actual failure or impending failure. It should be appreciated that the remote signal receiving device can have or obtain this normal amperage level data for the specific pump that the pump monitor is connected to in a variety of different manners in accordance with the present disclosure.

If the remote signal receiving device does not receive signals from the pump monitor regarding the amperage levels for (or a heartbeat or working properly signal) designated periods of time, the remote signal receiving device can determine that there is something wrong such as a power outage.

In a first manner, the remote signal receiving device is initiated with a predetermined amperage level and the pump monitor is rated for a pump with that amperage level.

In a second manner, the remote signal receiving device is initiated with a plurality of predetermined amperage levels and the pump monitor is rated for a pump having any one of those normal operating amperage levels. In this embodiment, the pump monitor first operates in an initiation mode, where the remote signal receiving device determines which of the different predetermined amperage levels is appropriate for the pump connected to that pump monitor.

In a third manner, the remote signal receiving device does not have any preset amperage levels. The pump monitor first operates in an initiation mode, and the remote signal receiving device determines the normal amperage level or levels of the pump connected to that pump monitor.

In a fourth manner, the remote signal receiving device does not have any preset amperage level. The remote signal receiving device receives an input from a device such as a user access device of the normal amperage level or levels of the pump connected to that pump monitor.

In a fifth manner, the remote signal receiving device does not have any preset amperage level. In one such embodiment, the pump monitor includes an input device such as a switch or dial (not shown). The input device enables the user to input the normal amperage level or levels of the pump connected to that pump monitor. In one such embodiment, the transmitter transmits this information to the remote signal receiving device.

It should be appreciated that other suitable manners of providing the remote signal receiving device with the appropriate amperage levels may be employed in accordance with the present disclosure.

In various embodiments, regardless of whether the determination is made by the onboard computer or the remote signal receiving device, if the determination is that the pump is not actually failing but will fail or is likely to fail relatively soon, the determination in various embodiments includes how likely it is that the pump will fail and the estimated time frame when the pump will fail.

For example, if a pump normally operates at 3 amps and starts to operate at 3.5 amps for a period of time and then starts to operate at 4 amps for a period of time, the onboard computer or the remote signal receiving device can be configured to detect this pattern and cause appropriate level warnings to be provided to the user. In one embodiment, the first warning is a first or low level warning which indicates a potential issue with the pump (such as the beginning of a blockage) which is causing the amperage level variation (such as a spike in the amperage usage level). In one embodiment, the second warning is a second or higher level warning which indicates a higher level potential issue with the pump. In one embodiment, the third warning is a highest level warning which indicates a failure of the pump.

It should thus be appreciated that the present disclosure contemplates that all of the warnings are the same in certain embodiments, and in other embodiments, the warnings provided to the user through the user access device vary in level, in frequency, and in formatting provided to the user.

In various alternative embodiments, the onboard computer or the remote signal receiving device is configured to determine the reason for the actual failure or likely failure based on the amount of the variation in the amperage level. For instance, the onboard computer or the remote signal receiving device is configured in certain embodiments to determine the difference between failures due to partial blockages or clogs, full blockages or clogs, bad or broken impellers, etc. In such embodiments, the onboard computer or the remote signal receiving device is configured to communicate or cause a communication of this reason for the actual or expected failure or the likely reason for the actual or expected failure. It should be appreciated that such information will be in most cases a prediction of the reason for the actual failure or likely failure by the onboard computer or the remote signal receiving device.

In the above described embodiments, the pump monitor includes an amperage detector. It should be appreciated that in other embodiments of the present disclosure, the pump monitor additionally or alternatively includes a detector configured to monitor one or more other characteristics of the electric current supplied to the pump through the pump monitor.

More specifically, it should be appreciated that the pump monitor can alternatively or additionally measure other electric current characteristics such as voltage. In simple terms, voltage is a measure of the pressure on the electrons to move out of the source. It is directly proportional to the pressure exerted on the electrons. In other words, the higher the voltage, the higher the pressure. For example, a battery of 3 volt will exert pressure on the electrons twice as hard as a battery of 1.5 volt. However, since voltage is more of a measurement of "potential" energy available, not necessarily how much is actually used by a pump, this characteristic may not be an optimal characteristic to measure for the monitor or system of the present disclosure.

It should also be appreciated that the pump monitor can alternatively or additionally measure other electric current characteristics such as wattage. In simple terms, wattage or watts are used to measure power consumption. The wattage or watts used by an electrical device is amps multiplied by volts. A current of one amp at one volt uses one watt of power. An electrical device rated at 10 amps plugged in to a 110-volt supply will use 1,110 watts.

It should thus be appreciated from the above, that in certain embodiments, the present disclosure provides a pump monitor including: (a) a portable housing; (b) an electric plug receptacle supported by the housing and configured to receive an electrical power source plug of a pump to enable the pump to receive electric current through pump monitor; (c) a power cord supported by the housing and configured to be plugged into an electrical power source; (d) a transmitter supported by the housing; (e) an amperage detector supported by the housing and configured to monitor amperage of the electric current supplied through the pump monitor to the pump; and (f) an onboard computer supported by the housing and configured to determine variations in amperage which indicate a predicted failure or actual failure of the pump. It should further be appreciated from the above, that in certain such embodiments, (a) the onboard computer is configured to operate with the transmitter to send out at least one of signal to cause a user access device to display a warning regarding the predicted failure or actual failure of the pump; (b) the onboard computer is configured to operate with the transmitter to send out at least one of signal to a remote signal receiving device regarding the predicted failure or actual failure of the pump; (c) the onboard computer is configured to operate with the transmitter to send out at least one of signal to cause a user access device to display an indication of normal operation of the pump; (d) the onboard computer is configured to operate with the transmitter to send out at least one of signal to a remote signal receiving device indicating normal operation of the pump; and/or (e) the onboard computer is configured to operate with the transmitter to send out at least one of signal to a remote signal receiving device of amperage level data.

It should also thus be appreciated from the above, that in certain embodiments, the present disclosure provides a pump monitor including: (a) a portable housing; (b) an electric plug receptacle supported by the housing and configured to receive an electrical power source plug of a pump to enable the pump to receive electric current through pump monitor; (c) a power cord supported by the housing and configured to be plugged into an electrical power source; (d) a transmitter supported by the housing; and (e) an amperage detector supported by the housing and configured to monitor amperage of the electric current supplied through the pump monitor to the pump. It should further be appreciated from the above, that in certain such embodiments, (a) the transmitter is configured to send out at least one of signal to a remote signal receiving device configured to determine variations in amperage which indicate a predicted failure or actual failure of the pump and to cause a user access device to display a warning regarding the predicted failure or actual failure of the pump; (b) the transmitter is configured to send out at least one of signal to a remote signal receiving device configured to cause a user access device to display an indication of normal operation of the pump; and/or (c) the transmitter is configured to send out at least one of signal to a remote signal receiving device of amperage level data.

The Pump Failure Warning System

The present disclosure further includes a pump failure warning system which generally includes one or more computers (such as servers) configured to communicate with one or more pump monitors (such as the "smart" or "dumb" pump monitors described above) and one or more user access devices as further described below. In various embodiments, the pump failure warning system provides certain or all of the functions specified above for the remote signal receiving device.

Referring now to FIG. 2, one embodiment of the pump failure warning system of the present disclosure is generally illustrated and indicated by numeral 100. In this illustrated embodiment, the system 100 includes a computer such as a server (not shown) configured to communicate through a data network 110 with: (a) a plurality pump monitors 120a, 120b, 120c . . . 120z (such as the pump monitors describe above) which are respectively connected to a plurality of pumps 130a, 130b, 130c . . . 130z; (b) a plurality of user access devices 140a, 140b, 140c . . . 140z, and (c) a plurality of third party data provider systems 160a, 160b, 160c . . . 160Z. The system 100 is configured to enable users to use the user access devices to access and communicate with the computer (or server) of the system 100 through the internet or any other suitable data network 110.

The computer (such as the server) includes one or more central processing units (not shown) and one or more memory devices (not shown) which store instructions (not shown) and one or more databases (not shown). It should be appreciated that any suitable computer (or server) may be employed in the system 100 of the present disclosure. This computer in this illustrated embodiment is configured to operate with several pump monitors at a single structure or location or multiple structures or locations.

The present disclosure contemplates that the user access devices 140a, 140b, 140c . . . 140z, can include any suitable user computer and/or computerized communication device. Such devices include but are not limited to: (a) a smart phone; (b) a tablet computing device; (c) a laptop computer; and (d) a desktop computer. Users operate the user access devices to access or communicate with the system 100 through the data network 110. It should be appreciated that in various embodiments, the system 100 operates with the user access devices through one or more software programs or applications downloaded to those user access devices (i.e., commonly called "apps"). It should be appreciated that in other various embodiments, the system 100 operates with the user access devices through one or more software programs or web sites accessible by those user access devices. It should be appreciated that in various embodiments, the system 100 operates with the user access devices through one or more software programs or applications downloaded to those user access devices and through one or more software programs or web sites accessible by those user access devices. It should be further appreciated that the system 100 and the user access devices can co-act in any other suitable manner in accordance with the present disclosure.

In various embodiments, the system 100 requires the users to register with the system 100. In such embodiments, each user has a user identifier (such as a name or e-mail address) and a password or other identifier to access or use the system 100. In various embodiments, a user must become a customer of the company or organization that operates the system 100 to use the system. It should be appreciated that the system 100 can be implemented by different types of operators such as, but not limited to, alarm companies, structure (such as home monitoring companies), property managers, pump retailers, pump wholesalers, pump distributor, and pump manufacturers.

The system 100 of the present disclosure causes the user access device to display: (a) certain images and/or information to the user regarding the normal operation of the pump monitor and the pump as well as any warnings regarding a predicted failure or actual failure of each of the pumps being monitored; and (b) enables the user to make certain inputs such as acknowledging that a warning signal from the pump monitor was received. Similarly, if the system is implemented in whole or part through an application downloaded to the user access device, the application causes the user access device to display certain images and/or information to the user and enables the user to make certain inputs. For brevity, throughout this application, sometimes instead of stating that the system (or application thereof) causes the user access device to display images and/or information to the user, the present application simply states this by stating that the system displays images and/or information to the user. Similarly, for brevity, sometimes instead of stating that the system (or application thereof) causes the user access device to enable the user to make inputs (such as making other inputs), the present application states this by stating that the system enables the user to make input of information. It should be appreciated that such statements are for brevity and not meant to limit the present disclosure.

It should further be appreciated that the system communicates with the pump monitors, the user access devices, and any third party data provider systems (discussed below) through any suitable wired, partially wired, or wireless data network. Thus, it should be appreciated that the system of the present disclosure can operate through any suitable central or remote network such as but not limited to a local area network (LAN), a wide area network (WAN), a cellular network, an intranet, and the internet.

As described above, the present disclosure contemplates that the pump monitors can have "smart" or "dumb" configurations. If the pump monitor has a "smart" configuration, in various embodiments, the pump monitor can send data such as normal operation data, amperage level data, amperage level variation or deviation data, and/or predicted failure or actual failure data to the remote signal receiving device. If the pump monitor has a "dumb" configuration, in various embodiments, the pump monitor sends normal operation or power on data and amperage level data to the remote signal receiving device.

In various embodiments, the system only takes into account the data received from the pump monitor to determine if the pump is likely to fail or is actually failing. In such situations, the system 100 sends one or more signals to the appropriate user access device to alert the user that the pump is likely to fail or is actually failing.

It should be appreciated as stated above that in various embodiments of the present disclosure, the system is configured to provide a single type of warning to the user through the user access device.

It should also be appreciated as stated above that in various other embodiments of the present disclosure, the system is configured to provide any one of a plurality of different types of warnings to the user through the user access device. For example, in these embodiments, the system 100 is configured to provide any of the following notifications and warnings to the user though the user access device: (1) pump operating normally; (2) pump operating at a determined amperage level; (3) pump not working; (4)

pump not working properly; (5) pump not working properly due likely to determined cause (such as partial blockage or bad impellor); (6) pump likely to fail; or (7) pump likely to fail in determined time period (such determined number of hours or determined number of days).

It should also be appreciated that in various embodiments, the system will display through the user access device any suitable additional information regarding the operation of the pump. For example, the pump monitor may transmit volume of water pumped data based on operation duration of the pump.

In various embodiments, the system additionally takes into account other data to determine if the pump is likely to fail or failing in addition to data provided by the pump monitor. More specifically, in various embodiments, the system additionally takes into account one or more of the following pump data to predict the likelihood that the pump will fail: (a) type or model of the pump and known data related to the failure rates of such pump; (b) previous failure(s) of the pump; (c) age of the pump; (d) usage data regarding the pump (such as high or low regular usage); (e) total quantity of pump activations; (f) quantity of pump activations per designated time period (i.e., an hour, a day, a week, a month, a year, etc); (g) volume of water pumped; (h) type of water pumped (e.g., sewage versus rain water); and (i) amount or components of the pump which is continually submerged in the water. It should be appreciated that the system can obtain this data in any suitable manner. In various embodiments, certain of this data is preloaded into the system. In various embodiments, the system accumulates this data for each pump or type or model of pump as the system is used and thus becomes better able to predict failures based on the continually growing data received by the system. In such embodiments, the system suitably stores data regarding each of pumps that the pump monitors to build the system database.

In various embodiments, the system 100 takes into account one or more of the following external or location data to predict the likelihood that the pump will fail such as, but not limited to: (a) weather or precipitation forecasts for the location of the structure; (b) ground water levels for the location of the structure; and (c) flood warnings for the location of the structure. It should be appreciated that the system obtains this data in a variety of different manners. In certain embodiments, the system obtains this data from one or more data provider sources 160a, 160b, 160c . . . 160z.

For instance, if the amperage levels result in a determination of a high probability of a pump failure, but all of the external or location factors the system has obtained (from a data provider source such as a weather information source) indicates that there is a low probability of need for operation of the pump and thus a low probability of a failure (because the pump will likely not need to operate in a designated time period (or operate for any significant lengths of time in the designated time period), the system can set the pump failure prediction at a medium level and provide such medium warning to the user through the respective user access device.

In various embodiments, each time the system makes a determination of whether the pump is likely to fail, the system determines a likelihood (such a percentage) that the pump will fail, and communicates this determination to the user access device for display to the user.

In various embodiments, the each time the system makes a determination of whether the pump is likely to fail, the system determines a likelihood (such a percentage) that the pump will fail in a designated period of time (such as a day, a week, or a month), and communicates this determination to the user access device for display to the user.

These predictions enable the user receiving these predictions though a user access device to determine the urgency of replacement or repair of the pump or each pump that the system is monitoring for the user. For example, a user may be a building maintainer which maintains multiple buildings (such as 50 buildings) in many different locations in a metropolitan area where each building has multiple pumps (such as 5 pumps). In this example, the user uses the system to monitor 250 pumps. If the user receives multiple failure warnings during or after a storm in the metropolitan area, the user can determine the order of service for the pumps based on the different warnings or warning levels.

It should thus be appreciated from the above, that in certain embodiments, the present disclosure provide a pump failure warning system including: a computer configured to communicate through a data network with: (a) a portable first pump monitor connected to a first pump, and (b) a first user access device; said computer configured to cause the first user access device to display: (i) information regarding normal operation of the first pump based on one or more signals received from the first pump monitor, and (ii) a warning regarding one of a predicted failure and actual failure of the first pump; and said computer configured to receive from the first user access device a signal representing an input made by a user acknowledging the warning. It should further be appreciated from the above, that in certain such embodiments, (a) the computer is configured to receive from the first pump monitor one of predicted failure data and actual failure data; (b) the computer is configured to receive from the first pump monitor amperage level data, and the computer is configured to determine any actual failure of the first pump and any predicted failure of the first pump; (c) the computer is configured to receive from the first pump monitor at least one of: normal operation data, amperage level data, amperage level variation or deviation data, and predicted failure or actual failure data; (d) the computer is configured to communicate through the data network with at least one third party data provider system.

It should be appreciated that the pump failure warning system of the present disclosure can be employed in conjunction with one or more other proposed or commercially available pump failure detection systems if those other pump failure detection systems are provided with transmitters of amperage levels.

It should also be appreciated that the pump failure warning system of the present disclosure can be employed in conjunction with one or more battery or otherwise powered back-up pumps if those pumps are provided with transmitters of amperage levels.

As mentioned above, the pump monitor and the pump failure warning system of the various embodiments of the present disclosure can be employed for other suitable pumps (besides sump and ejector pumps).

It should be understood that modifications and variations may be effected without departing from the scope of the novel concepts of the present invention, and it should be understood that this application is to be limited only by the scope of the claims.

The invention is claimed as follows:

1. A sump pump monitor for a sump pump including a pump, an AC electric power source plug, and an automatic float switch, said sump pump monitor comprising:
   (a) a portable housing;
   (b) an electric plug receptacle physically supported by the housing and configured to receive the AC electric power source plug of the sump pump to enable the sump pump to continuously receive electric current through the sump pump monitor to enable the automatic float switch of the sump pump to turn the pump of the sump pump on when a water level rises above a predetermined level and to turn the pump of the sump pump off when the water level is below the predetermined level;

(c) an electric power plug physically supported by the housing and configured to be plugged into an AC electrical power source, the housing, the electric plug receptacle, and the electric power plug configured to enable the sump pump to continuously receive electric current through the sump pump monitor and enable the sump pump to turn itself on and off;

(d) a transmitter physically supported by the housing;

(e) an amperage detector physically supported by the housing and configured to continuously monitor amperage of electric current supplied through the sump pump monitor to the sump pump;

(f) an onboard computer physically supported by the housing and configured to: (i) operate with the transmitter to send out at least one signal indicating normal operation of the sump pump to a remote signal receiving device to cause a user access device separate from the remote signal receiving device to display an indication of normal operation of the sump pump; (ii) determine variation in starting amperage from a first normal starting amperage level above zero for the sump pump to a second different non-normal starting amperage level above zero for the sump pump; (iii) determine variation in operating amperage from a first normal operating amperage level above zero for the sump pump to a second different non-normal operating amperage level above zero for the sump pump; (iv) use any such determined variations in starting amperage itself and in operating amperage itself to determine a predicted failure or actual failure of at least part of the sump pump; and (v) operate with the transmitter to send out at least one signal regarding the predicted failure or actual failure of at least part of the sump pump to the remote signal receiving device to cause the user access device to display a warning regarding the predicted failure or actual failure of at least part of the sump pump; and (g) an input device physically supported by the housing and connected to the onboard computer and configured to enable an input of the normal starting amperage level of the sump pump and an input of the normal operating amperage level of the sump pump.

2. The sump pump monitor of claim 1, wherein the variation in starting amperage from the first normal starting amperage level above zero for the sump pump to the second non-normal starting amperage level above zero for the sump pump is one of: (1) a normal starting amperage level to a non-normal higher starting amperage level; and (2) a normal starting amperage level to a non-normal lower starting amperage level; and wherein the variation in operating amperage from the first normal operating amperage level above zero for the sump pump to the second non-normal operating amperage level above zero for the sump pump is one of: (3) a normal operating amperage level to a non-normal higher operating amperage level; and (4) a normal operating amperage level to a non-normal lower operating amperage level.

3. The sump pump monitor of claim 1, which includes at least one indicator supported by the housing and configured to indicate at least one of: (1) that the sump pump is working properly; (2) that the sump pump is not working; (3) that the sump pump is not working properly; and (4) that the sump pump is likely to fail.

4. The sump pump monitor of claim 3, wherein the indicator includes a meter configured to continuously indicate the amperage measurements that the amperage detector detects.

5. A sump pump monitor for a sump pump including a pump, an AC electric power source plug, and an automatic float switch, said sump pump monitor comprising:

(a) a portable housing;

(b) an electric plug receptacle physically supported by the housing and configured to receive the electric power source plug of the sump pump to enable the sump pump to continuously receive electric current through the sump pump monitor to enable the automatic float switch of the sump pump to turn the pump of the sump pump on when a water level rises above a predetermined level and to turn the pump of the sump pump off when the water level is below the predetermined level;

(c) an electric power plug physically supported by the housing and configured to be plugged into an electrical power source, the housing, the electric plug receptacle, and the electric power plug configured to enable the sump pump to continuously receive electric current through the sump pump monitor and enable the sump pump to turn itself on and off;

(d) a transmitter physically supported by the housing; and (e) an amperage detector physically supported by the housing and configured to continuously monitor amperage of electric current supplied through the sump pump monitor to the sump pump to detect a plurality of different amperage levels above zero of the sump pump including a starting amperage level of the sump pump and an operating amperage level of the sump pump, and to operate with the transmitter to send out signals to a remote signal receiving device to: (i) cause a user access device separate from the remote signal receiving device to display an indication of normal operation of the sump pump; (ii) enable a determination of a variation from a first normal starting amperage level above zero for the sump pump to a second different non-normal starting amperage level above zero for the sump pump based on a determined normal starting amperage level of the sump pump; and (iii) enable a determination of a variation from a first normal operating amperage level above zero for the sump pump to a second different non-normal operating amperage level above zero for the sump pump based on a determined normal operating amperage level of the sump pump, wherein any such determined variations in starting amperage itself and operating amperage itself are used to determine a predicted failure or actual failure of at least part of the sump pump and to cause the user access device to display a warning regarding the predicted failure or actual failure of at least part of the sump pump.

6. The sump pump monitor of claim 5, wherein the transmitter is configured to send out signals to the remote signal receiving device representing amperage level data.

7. The sump pump monitor of claim 5, wherein the variation in amperage from the first normal starting amperage level above zero for the sump pump to the second non-normal starting amperage level above zero for the pump is one of: (1) a normal starting amperage level to a non-normal higher starting amperage level; and (2) a normal starting amperage level to a non-normal lower starting amperage level; and wherein the variation in operating amperage from the first normal operating amperage level above zero for the sump pump to the second non-normal operating amperage level above zero for the sump pump is one of: (3) a normal running amperage level to a non-normal higher running amperage level; and (4) a normal running amperage level to a non-normal lower running amperage level.

8. The sump pump monitor of claim 5, which includes at least one indicator supported by the housing and configured to indicate at least one of: (1) that the sump pump is working properly; (2) that the sump pump is not working; (3) that the sump pump is not working properly; and (4) that the sump pump is likely to fail.

9. The sump pump monitor of claim 8, wherein the indicator includes a meter configured to continuously indicate the amperage measurements that the amperage detector detects.

10. A sump pump monitor for a sump pump including a pump, an AC electric power source plug, and an automatic float switch, said sump pump monitor comprising:
(a) a portable housing;
(b) an electric plug receptacle physically supported by the housing and configured to receive the AC electric power source plug of the sump pump to enable the sump pump to continuously receive electric current through the sump pump monitor to enable the automatic float switch of the sump pump to turn the pump of the sump pump on when a water level rises above a predetermined level and to turn the pump of the sump pump off when the water level is below the predetermined level;
(c) an electric power plug physically supported by the housing and configured to be plugged into an AC electrical power source, the housing, the electric plug receptacle, and the electric power plug configured to enable the sump pump to continuously receive electric current through the sump pump monitor and enable the sump pump to turn itself on and off;
(d) a transmitter physically supported by the housing;
(e) an amperage detector physically supported by the housing and configured to continuously monitor amperage of electric current supplied through the sump pump monitor to the sump pump; and
(f) an onboard computer physically supported by the housing and configured to: (i) operate with the transmitter to send out at least one signal indicating normal operation of the sump pump to a remote signal receiving device to cause a user access device separate from the remote signal receiving device to display an indication of normal operation of the sump pump; (ii) determine variation in starting amperage from a first normal starting amperage level above zero for the sump pump to a second different non-normal starting amperage level above zero for the sump pump; (iii) determine variation in operating amperage from a first normal operating amperage level above zero for the sump pump to a second different non-normal operating amperage level above zero for the sump pump; (iv) use any such determined variations in starting amperage itself and in operating amperage itself to determine a predicted failure or actual failure of at least part of the sump pump; and (v) operate with the transmitter to send out at least one signal regarding the predicted failure or actual failure of at least part of the sump pump to the remote signal receiving device to cause the user access device to display a warning regarding the predicted failure or actual failure of at least part of the sump pump; and wherein the onboard computer is initiated with the first normal starting amperage level for the sump pump and the onboard computer is initiated with the first normal operating amperage level for the sump pump.

11. The sump pump monitor of claim 10, wherein the variation in starting amperage from the first normal starting amperage level above zero for the sump pump to the second non-normal starting amperage level above zero for the sump pump is one of: (1) a normal starting amperage level to a non-normal higher starting amperage level; and (2) a normal starting amperage level to a non-normal lower starting amperage level; and wherein the variation in operating amperage from the first normal operating amperage level above zero for the sump pump to the second non-normal operating amperage level above zero for the sump pump is one of: (3) a normal operating amperage level to a non-normal higher operating amperage level; and (4) a normal operating amperage level to a non-normal lower operating amperage level.

12. The sump pump monitor of claim 10, which includes at least one indicator supported by the housing and configured to indicate at least one of: (1) that the sump pump is working properly; (2) that the sump pump is not working; (3) that the sump pump is not working properly; and (4) that the sump pump is likely to fail.

13. The sump pump monitor of claim 12, wherein the indicator includes a meter configured to continuously indicate the amperage measurements that the amperage detector detects.

14. A sump pump monitor for a sump pump including a pump, an AC electric power source plug, and an automatic float switch, said sump pump monitor comprising:
(a) a portable housing;
(b) an electric plug receptacle physically supported by the housing and configured to receive the AC electric power source plug of the sump pump to enable the sump pump to continuously receive electric current through the sump pump monitor to enable the automatic float switch of the sump pump to turn the pump of the sump pump on when a water level rises above a predetermined level and to turn the pump of the sump pump off when the water level is below the predetermined level;
(c) an electric power plug physically supported by the housing and configured to be plugged into an AC electrical power source, the housing, the electric plug receptacle, and the electric power plug configured to enable the sump pump to continuously receive electric current through the sump pump monitor and enable the sump pump to turn itself on and off;
(d) a transmitter physically supported by the housing;
(e) an amperage detector physically supported by the housing and configured to continuously monitor amperage of electric current supplied through the sump pump monitor to the sump pump; and
(f) an onboard computer physically supported by the housing and configured to: (i) operate with the transmitter to send out at least one signal indicating normal operation of the sump pump to a remote signal receiving device to cause a user access device separate from the remote signal receiving device to display an indication of normal operation of the sump pump; (ii) determine variation in starting amperage from a first normal starting amperage level above zero for the sump pump to a second different non-normal starting amperage level above zero for the sump pump; (iii) determine variation in operating amperage from a first normal operating amperage level above zero for the sump pump to a second different non-normal operating amperage level above zero for the sump pump; (iv) use any such determined variations in starting amperage itself and in operating amperage itself to determine a predicted failure or actual failure of at least part of the sump pump; and (v) operate with the transmitter to send out at least one signal regarding the predicted failure or actual failure of at least part of the sump pump to the remote signal receiving device to cause the user access device to display a warning regarding the predicted failure or actual failure of at least part of the sump pump; and wherein the onboard computer is initiated with a plurality of normal amperage levels for the sump pump including a plurality of normal starting amperage levels and a plurality of different normal operating amperage levels, and the onboard computer is configured to operate in an initiation mode to determine which of the different normal starting and operating amperage levels is appropriate for the sump pump.

15. The sump pump monitor of claim 14, wherein the variation in starting amperage from the first normal starting amperage level above zero for the sump pump to the second non-normal starting amperage level above zero for the sump pump is one of: (1) a normal starting amperage level to a non-normal higher starting amperage level; and (2) a normal starting amperage level to a non-normal lower starting amperage level; and wherein the variation in operating amperage from the first normal operating amperage level above zero for the sump pump to the second non-normal operating amperage level above zero for the sump pump is one of: (3) a normal operating amperage level to a non-normal higher operating amperage level; and (4) a normal operating amperage level to a non-normal lower operating amperage level.

16. The sump pump monitor of claim 14, which includes at least one indicator supported by the housing and configured to indicate at least one of: (1) that the sump pump is working properly; (2) that the sump pump is not working; (3) that the sump pump is not working properly; and (4) that the sump pump is likely to fail.

17. The sump pump monitor of claim 16, wherein the indicator includes a meter configured to continuously indicate the amperage measurements that the amperage detector detects.

18. A sump pump monitor for a sump pump including a pump, an AC electric power source plug, and an automatic float switch, said sump pump monitor comprising:
(a) a portable housing;
(b) an electric plug receptacle physically supported by the housing and configured to receive the AC electric power source plug of the sump pump to enable the sump pump to continuously receive electric current through the sump pump monitor to enable the automatic float switch of the sump pump to turn the pump of the sump pump on when a water level rises above a predetermined level and to turn the pump of the sump pump off when the water level is below the predetermined level;
(c) an electric power plug physically supported by the housing and configured to be plugged into an AC electrical power source, the housing, the electric plug receptacle, and the electric power plug configured to enable the sump pump to continuously receive electric current through the sump pump monitor and enable the sump pump to turn itself on and off;
(d) a transmitter physically supported by the housing;
(e) an amperage detector physically supported by the housing and configured to continuously monitor amperage of electric current supplied through the sump pump monitor to the sump pump; and
(f) an onboard computer physically supported by the housing and configured to: (i) operate with the transmitter to send out at least one signal indicating normal operation of the sump pump to a remote signal receiving device to cause a user access device separate from the remote signal receiving device to display an indication of normal operation of the sump pump; (ii) determine variation in starting amperage from a first normal starting amperage level above zero for the sump pump to a second different non-normal starting amperage level above zero for the sump pump; (iii) determine variation in operating amperage from a first normal operating amperage level above zero for the sump pump to a second different non-normal operating amperage level above zero for the sump pump; (iv) use any such determined variations in starting amperage itself and in operating amperage itself to determine a predicted failure or actual failure of at least part of the sump pump; and (v) operate with the transmitter to send out at least one signal regarding the predicted failure or actual failure of at least part of the sump pump to the remote signal receiving device to cause the user access device to display a warning regarding the predicted failure or actual failure of at least part of the sump pump; and wherein the onboard computer is configured to operate in an initiation mode to determine the normal starting amperage level of the sump pump and the normal operating amperage level of the sump pump.

19. The sump pump monitor of claim 18, wherein the variation in starting amperage from the first normal starting amperage level above zero for the sump pump to the second non-normal starting amperage level above zero for the sump pump is one of: (1) a normal starting amperage level to a non-normal higher starting amperage level; and (2) a normal starting amperage level to a non-normal lower starting amperage level; and wherein the variation in operating amperage from the first normal operating amperage level above zero for the sump pump to the second non-normal operating amperage level above zero for the sump pump is one of: (3) a normal operating amperage level to a non-normal higher operating amperage level; and (4) a normal operating amperage level to a non-normal lower operating amperage level.

20. The sump pump monitor of claim 18, which includes at least one indicator supported by the housing and configured to indicate at least one of: (1) that the sump pump is working properly; (2) that the sump pump is not working; (3) that the sump pump is not working properly; and (4) that the sump pump is likely to fail.

21. The sump pump monitor of claim 20, wherein the indicator includes a meter configured to continuously indicate the amperage measurements that the amperage detector detects.

22. A sump pump monitor for a sump pump including a pump, an AC electric power source plug, and an automatic float switch, said sump pump monitor comprising:
(a) a portable housing;
(b) an electric plug receptacle physically supported by the housing and configured to receive the AC electric power source plug of the sump pump to enable the sump pump to continuously receive electric current through the sump pump monitor to enable the automatic float switch of the sump pump to turn the pump of the sump pump on when a water level rises above a predetermined level and to turn the pump of the sump pump off when the water level is below the predetermined level;

(c) an electric power plug physically supported by the housing and configured to be plugged into an AC electrical power source, the housing, the electric plug receptacle, and the electric power plug configured to enable the sump pump to continuously receive electric current through the sump pump monitor and enable the sump pump to turn itself on and off;

(d) a transmitter physically supported by the housing;

(e) an amperage detector physically supported by the housing and configured to continuously monitor amperage of electric current supplied through the sump pump monitor to the sump pump; and (f) an onboard computer physically supported by the housing and configured to: (i) operate with the transmitter to send out at least one signal indicating normal operation of the sump pump signal to a remote signal receiving device to cause a user access device separate from the remote signal receiving device to display an indication of normal operation of the sump pump; (ii) determine variation in starting amperage from a first normal starting amperage level above zero for the sump pump to a second different non-normal starting amperage level above zero for the sump pump; (iii) determine variation in operating amperage from a first normal operating amperage level above zero for the sump pump to a second different non-normal operating amperage level above zero for the sump pump; (iv) use any such determined variations in starting amperage itself and in operating amperage itself to determine a predicted failure or actual failure of at least part of the sump pump; and (v) operate with the transmitter to send out at least one signal regarding the predicted failure or actual failure of at least part of the sump pump to the remote signal receiving device to cause the user access device to display a warning regarding the predicted failure or actual failure of at least part of the sump pump; and wherein the onboard computer is configured to receive at least one signal from a remote device wherein the at least one signal indicates the normal starting amperage level of the sump pump and the normal operating amperage level of the sump pump.

23. The sump pump monitor of claim 22, wherein the variation in starting amperage from the first normal starting amperage level above zero for the sump pump to the second non-normal starting amperage level above zero for the sump pump is one of: (1) a normal starting amperage level to a non-normal higher starting amperage level; and (2) a normal starting amperage level to a non-normal lower starting amperage level; and wherein the variation in operating amperage from the first normal operating amperage level above zero for the sump pump to the second non-normal operating amperage level above zero for the sump pump is one of: (3) a normal operating amperage level to a non-normal higher operating amperage level; and (4) a normal operating amperage level to a non-normal lower operating amperage level.

24. The sump pump monitor of claim 22, which includes at least one indicator supported by the housing and configured to indicate at least one of: (1) that the sump pump is working properly; (2) that the sump pump is not working; (3) that the sump pump is not working properly; and (4) that the sump pump is likely to fail.

25. The sump pump monitor of claim 24, wherein the indicator includes a meter configured to continuously indicate the amperage measurements that the amperage detector detects.

* * * * *